United States Patent
Britton et al.

(10) Patent No.: US 7,763,530 B2
(45) Date of Patent: Jul. 27, 2010

(54) DOPING OF PARTICULATE SEMICONDUCTOR MATERIALS

(75) Inventors: David Thomas Britton, Cape Town (ZA); Margit Härting, Cape Town (ZA)

(73) Assignee: University of Cape Town, Cape Town (ZA)

( * ) Notice: Subject to any disclaimer, the term of this patent is extended or adjusted under 35 U.S.C. 154(b) by 307 days.

(21) Appl. No.: 11/990,816

(22) PCT Filed: Aug. 23, 2006

(86) PCT No.: PCT/IB2006/002290
§ 371 (c)(1),
(2), (4) Date: Mar. 20, 2008

(87) PCT Pub. No.: WO2007/023362
PCT Pub. Date: Mar. 1, 2007

(65) Prior Publication Data
US 2009/0092855 A1 Apr. 9, 2009

(30) Foreign Application Priority Data
Aug. 23, 2005 (ZA) .............................. 2005/06752

(51) Int. Cl.
*H01L 21/00* (2006.01)
(52) U.S. Cl. ............ 438/514; 438/542; 438/565; 257/E21.014; 257/E21.153
(58) Field of Classification Search ............ 438/514, 438/542, 565; 257/E21.014, 153
See application file for complete search history.

(56) References Cited
U.S. PATENT DOCUMENTS

| | | | | |
|---|---|---|---|---|
| 3,709,813 A | * | 1/1973 | Johnson et al. | ............. 204/420 |
| 3,776,770 A | * | 12/1973 | Lando | ........................ 438/514 |
| 5,677,546 A | * | 10/1997 | Yu | ................................ 257/40 |
| 5,926,727 A | | 7/1999 | Stevens et al. | |
| 6,200,508 B1 | | 3/2001 | Jacobson et al. | |
| 6,306,555 B1 | * | 10/2001 | Schulz et al. | ............. 430/270.1 |
| 6,331,477 B1 | * | 12/2001 | Vekris et al. | ................. 438/542 |
| 6,468,806 B1 | * | 10/2002 | McFarland et al. | ........... 436/518 |
| 7,232,484 B2 | * | 6/2007 | Cretella et al. | ................. 117/19 |
| 7,575,699 B2 | * | 8/2009 | Strouse et al. | .................. 264/5 |
| 2005/0008880 A1 | | 1/2005 | Kunze et al. | |
| 2008/0193766 A1 | * | 8/2008 | Anderson et al. | ........... 428/403 |

(Continued)

OTHER PUBLICATIONS

International Search Report mailed Dec. 27, 2006 corresponding to PCT/IB2006/002290.
Arnold, N. et al., "Diffusion in III-V semiconductors from spin-on film sources," J. Phys. D. Appl. Phys., 1984, 17:443-474.

(Continued)

*Primary Examiner*—Michael S Lebentritt
(74) *Attorney, Agent, or Firm*—Kilpatrick Stockton LLP

(57) ABSTRACT

The invention relates to a method of doping semiconductor material. Essentially, the method comprises mixing a quantity of particulate semiconductor material with an ionic salt or a preparation of ionic salts. Preferably, the particulate semiconductor material comprises nanoparticles with a size in the range 1 nm to 100 μm. Most preferably, the particle size is in the range from 50 nm to 500 nm. Preferred semiconductor materials are intrinsic and metallurgical grade silicon. The invention extends to a printable composition comprising the doped semiconductor material as well as a binder and a solvent. The invention also extends to a semiconductor device formed from layers of the printable composition having p and n type properties.

34 Claims, 4 Drawing Sheets

U.S. PATENT DOCUMENTS

2009/0202816 A1* 8/2009 Schlenoff .................. 428/331
2009/0320919 A1* 12/2009 Tsuchiya et al. ............ 136/256
2010/0044640 A1* 2/2010 Agrawal et al. ........ 252/301.36

OTHER PUBLICATIONS

Song, S.H. et al., "Cd-vacancy-related excitonic emission in CdTe," J. Crystal Growth, 2003, 257:231-236.

* cited by examiner

DOPING OF PARTICULATE SEMICONDUCTOR MATERIALS

BACKGROUND OF THE INVENTION

THIS invention relates to a method of doping particulate semiconductor material. In particular, the invention relates to the doping of semiconductor nanoparticles, but has general applicability to the doping of particles with a wide range of sizes.

Semiconductor nanoparticles, with a characteristic size of a few nanometres up to several hundred nanometres, are a widely studied type of material, in which size effects dominate over properties of the bulk material. In general, depending on the specific material and its application, three different size-related phenomena may change the electronic, optical, thermal and mechanical properties of such nanoparticles:
1. a different structure and composition compared to the known bulk phases;
2. the higher surface to volume ratio of the particles compared to the bulk phase, which causes surface states and processes to dominate; and
3. quantum confinement effects when the size of the object is similar to or smaller than the wavelength and coherence length of a fundamental excitation (electronic state, optical wavelength or phonon excitation).

A specific problem concerns the control of the doping level of either the semiconducting particles, the semiconducting layer, or the composite semiconducting material, as the case may be. In known processes, use has been made of previously doped bulk material which is comminuted to a small particle size. Another possibility is to incorporate dopant atoms into the nanomaterial during bottom-up synthesis of nanoscale clusters. In all cases, even though the doping type (n or p) is normally maintained on the nanoscale, the electrical characteristics of the particles, and compositions thereof, may differ significantly from the bulk prototype, and be difficult to control.

It is an object of the invention to provide an alternative method of doping particulate semiconductor material.

SUMMARY OF THE INVENTION

According to a first aspect of the invention there is provided a method of doping semiconductor material, the method comprising mixing a quantity of particulate semiconductor material with an ionic salt or a preparation of ionic salts.

By "doping" is meant changing the carrier concentration and/or type of the semiconductor material.

The ionic salt or preparation of ionic salts may comprise one or more metal halides.

Alternatively, the ionic salt or preparation of ionic salts comprises one or more alkali halides, rare earth halides, or transition metal halides; one or more alkali metal salts; one or more rare earth salts; one or more transition metal salts; or sulphates, carbonates, nitrates or similar anionic complexes. The ionic salt or preparation of ionic salts may comprise a compound comprising a metal cation and anion group.

The method may comprise the addition of a preparation of ionic salts with an excess of a cationic species, achieved by the addition of the base of the corresponding salt, to a quantity of particulate semiconductor material.

The cationic species may be an alkali metal, rare earth metal, transition metal or other positively charged metal ion.

For example, the salt may be sodium chloride (NaCl) and the base may be sodium hydroxide (NaOH).

By way of another example, the salt may be magnesium chloride ($MgCl_2$) and the base may be magnesium hydroxide ($Mg(OH)_2$).

The method may comprise the addition of a preparation of ionic salts with an excess of an anionic species, achieved by the addition of the acid of the corresponding salt, to a quantity of particulate semiconductor material.

In this case, the anionic species may be a halogen, sulphate, carbonate, nitrate or other negatively charged species or complex.

For example, the salt may be sodium chloride (NaCl) and the acid may be hydrochloric acid (HCl).

In another example, the salt may be magnesium chloride ($MgCl_2$) and the acid may be hydrochloric acid (HCl).

The particulate semiconductor material may comprise a group IV element; a binary, ternary or quaternary compound semiconductor; an oxide; or a chalcogenide semiconductor material.

In a preferred embodiment, the particulate semiconductor material comprises silicon.

The particulate semiconductor material may comprise intrinsic material such as intrinsic silicon.

Alternatively, the particulate semiconductor material may comprise n-type material such as metallurgical grade silicon.

The particulate semiconductor material may have a particle size in the range 1 nm to 100 µm.

Preferably, the particulate semiconductor material has a particle size in the range from 10 nm to 1000 nm, and most preferably in the range from 50 nm to 500 nm.

In one embodiment, the particulate semiconductor material comprises nominally intrinsic silicon nanopowder with a mean particle size of 60 nm.

In another embodiment, the particulate semiconductor material comprises metallurgical grade silicon nanopowder with a mean particle size of 200 nm.

According to a second aspect of the invention there is provided a printable composition comprising particulate semiconductor material doped according to the method defined above, a binder, and a solvent.

The printable composition may comprise particulate semiconductor material that has been doped with an ionic salt or a preparation of the salt prior to mixing with the binder and/or solvent.

Alternatively, the particulate semiconductor material may comprise particulate semiconductor material that has been mixed with the binder and/or solvent prior to addition of an ionic salt or a preparation of the salt. The binder may be cellulose acetate butyrate (CAB), and the solvent may be chloroform, acetone or thinners.

Alternatively, the binder may be a polyester or autopolymerising ester (monomer) and the solvent may be an alcohol, acetone or thinners.

In the case where the solvent is an alcohol, it may be ethanol.

According to a third aspect of the invention there is provided a semiconducting composite composed of an admixture of particulate semiconductor material doped according to the method defined above, and a binder.

According to a fourth aspect of the invention there is provided a semiconductor device comprising a substrate, first and second layers of semiconducting material deposited on the substrate in contact with one another, and respective electrical contacts made to the first and second layers, wherein each of the first and second layers comprises a printable composition as defined above, one of the first and second layers having n-type properties and the other of the first and second layers having p-type properties so that a p-n junction is defined between the layers.

DESCRIPTION OF EMBODIMENTS

Figure 1A:
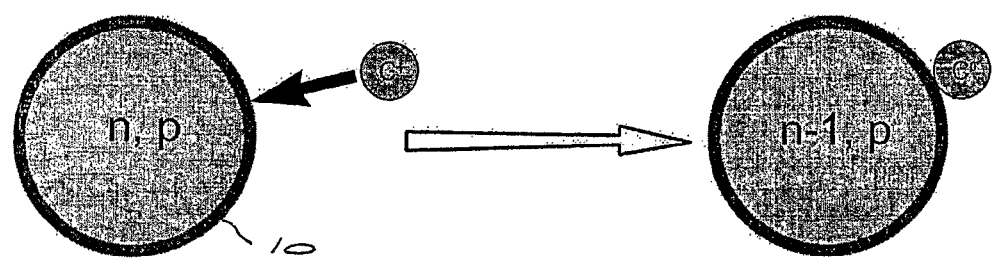
FIGS. 1(a) and 1(b) are schematic diagrams illustrating the chemical mechanism of a doping process according to the invention.

The invention concerns a method of doping particulate semiconductor material in general, and nanoparticles in particular, as well as compositions and composite materials made from them. This is achieved by the addition of an ionic salt, or a preparation of different ionic salts, to a quantity of the particulate material or particles as a dopant.

The term "salt" should be interpreted sufficiently broadly to include any material generally referred to as a salt, including an alkali halide, e.g. NaCl, a rare earth halide, e.g. $MgCl_2$, or including any complex anion group, such as sulphates, nitrates, carbonates, acetates or the like.

The salt may be added to the semiconducting material by first dissolving it in water, or another suitable solvent, mixing with the particulate semiconductor material and then drying. Alternatively, the dopant salt may be directly mixed into a composition consisting of the particulate semiconductor, a binder and/or a solvent.

In the method of the invention, doped semiconducting particles are produced by doping that is effected on the semiconducting particles themselves, rather than on bulk semiconducting material, of which the particles are constituted, as would normally be the case in conventional semiconductor technology. In conventional semiconductor materials, p-type doping, for example, occurs typically by the addition of a trivalent atom which accepts an electron, thus becoming negatively ionised, because of its incorporation into the crystal structure. In other circumstances the opposite occurs. In a chemical reaction, the same atom will become positively ionised by donating one or more electrons.

Because the whole particle is doped, the method of the invention is therefore applicable to all particulate semiconductors, over all size scales from nanometres to tens, or hundreds, of microns, and composed of any suitable material including elemental semiconductors such as silicon, binary and tertiary compounds, chalcogenides and oxides. Also the method is applicable to particles in any structural phase, whether crystalline, amorphous, or a mixture of both.

The addition of an ionic salt to a quantity of semiconducting particles leads to adsorption of the salt onto the surface of each particle or, more rarely, absorption into it of an ion, which changes the free carrier concentration of the whole particle, thus influencing its electronic properties, as well as those of a composite material containing many such particles. The addition of an ionic salt can be used not only to modify the carrier density, but also to change the particulate semiconductor from n-type to p-type and vice versa. This allows much lower tolerances on the purity and electrical properties of the material used to produce the particles. In particular, metallurgical grade silicon, which is generally n-type, can be modified without prior refinement to produce p-n junctions and other similar semiconductor device structures.

The detailed mechanisms of the doping process caused by the addition of an ionic salt are still being investigated. At present there are two possible mechanisms, shown in FIG. 1. The simplest scenario is absorption or adsorption of an ion, by a particle which is then neutralised. A positively charged cation will then accept an electron from the particle, resulting in overall p-type doping. Similarly a negatively charged anion would donate an electron, leading to overall n-type doping.

In FIG. 1(a) a free (positive) cation C+ is adsorbed or absorbed by a semiconducting particle 10 containing a total of n electrons and p holes. The cation is neutralised by removing an electron from the semiconducting particle. The neutral species C° may remain attached to the particle 10.

In the second case, if the ion is adsorbed, but maintains its charge state, for charge to be conserved the particle has to change its overall charge by the opposite of that of the ion. For this to occur, the ion will most likely be adsorbed onto the surface of the particle. In this case if an anion is adsorbed, the particle will lose an electron. In a liquid environment, this will most probably occur by neutralisation of a positively charged species, such as a cation, or by the ionisation of a neutral species in solution.

Figure 1B:
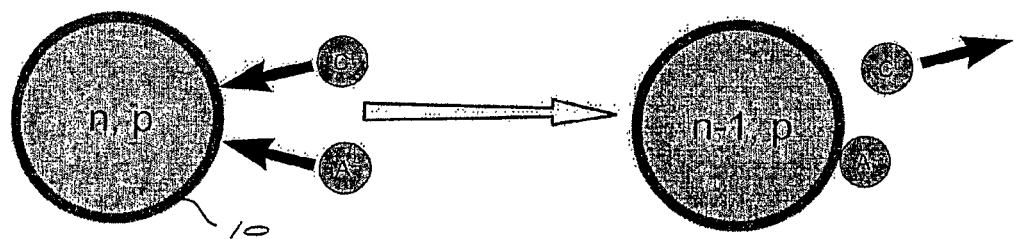

In FIG. 1(b), a free (negative) anion A⁻ is adsorbed or absorbed by a semiconducting particle 10 containing a total of n electrons and p holes. The cation C+ retains its charge state, and to maintain overall neutrality, an electron has to be removed by neutralisation of a free cation or ionisation of a neutral species.

In either situation the doping may be adjusted by buffering the salt solution with the acid corresponding to the anion, e.g. HCl in the case of NaCl, or the base corresponding to the cation, e.g. NaOH in the case of NaCl. Buffering with hydrochloric acid (HCl) adds chlorine ions (Cl⁻) while buffering with sodium hydroxide (NaOH) adds sodium ions (Na⁺), thus changing the Na:Cl ratio of the solution.

The above described method of doping was performed on a semiconducting nanoparticulate ink prepared from a commercially available silicon nanopowder, of mean size 60 nm, from MTI Crystals Corp. Printed layers, produced using an ink comprising the above specified Si nanopowder and different inert binders, all showed light n-type conductivity as seen by Hall effect measurements, although the powder as supplied is nominally intrinsic. In the third example, the powder used was milled to 200 nm mean size from 2305 grade metallurgical silicon provided by Silicon Smelters (Pty) Ltd, South Africa.

EXAMPLE 1

P-Type Doping with NaCl

In the first example of doping semiconductor nanoparticles according to the invention, sodium chloride was used to change the doping level and doping type of the nanoparticulate ink, produced from the nominally intrinsic commercially obtained nanopowder specified above, by its addition in various proportions by weight relative to the amount of powder. The quantity of binder was kept constant, at an amount equivalent to 8% by volume of the undoped composition. An autopolymerising ester was used as a binder, with ethanol being used as a solvent.

Figure 2A:
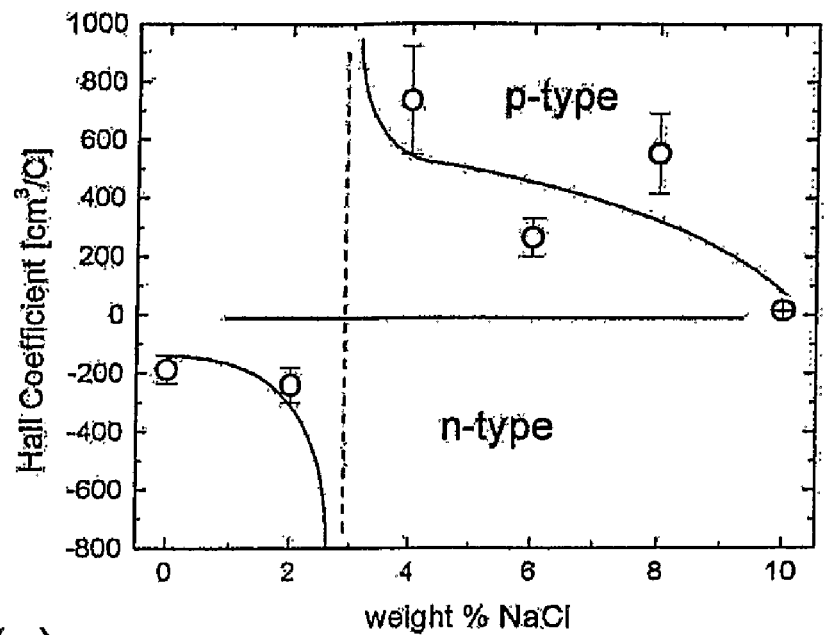
FIGS. 2(a) and 2(b) are graphs illustrating changes in the Hall coefficient of nanoparticulate silicon inks doped with NaCl and $MgCl_2$, respectively.

FIG. 2(a) shows the behaviour of the Hall coefficient, which is inversely proportional to the net carrier concentration, as a function of the amount of NaCl added to the mixture. At 2% by weight of NaCl, the printed layer remains n-type, but has a slightly lower carrier concentration, and a more negative Hall coefficient than the undoped material. Between 2% and 4% of NaCl added, the material has changed from an n-type to a p-type semiconductor. For 4% and more NaCl added, the Hall coefficient is positive, and decreases with increasing concentration. At 10% the Hall coefficient is very low, but remains positive.

It can be inferred from the above data that the amount of NaCl added to the mixture should be in the range of approximately 0 to 10% by weight [approximately 0 to 5 molar %].

Figure 3A:
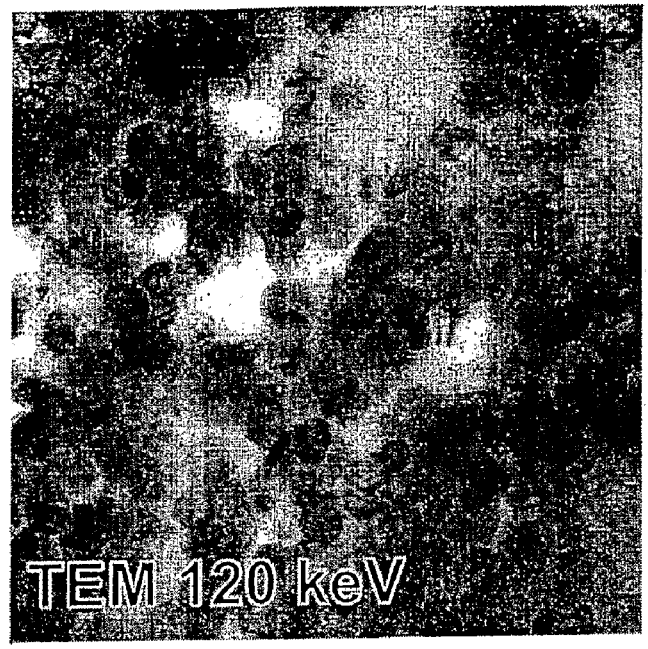
FIGS. 3(a) and 3(b) are a transmission electron micrograph and a corresponding elemental map, respectively, of silicon nanopowder doped with 10% NaCl by weight.
Figure 3B:
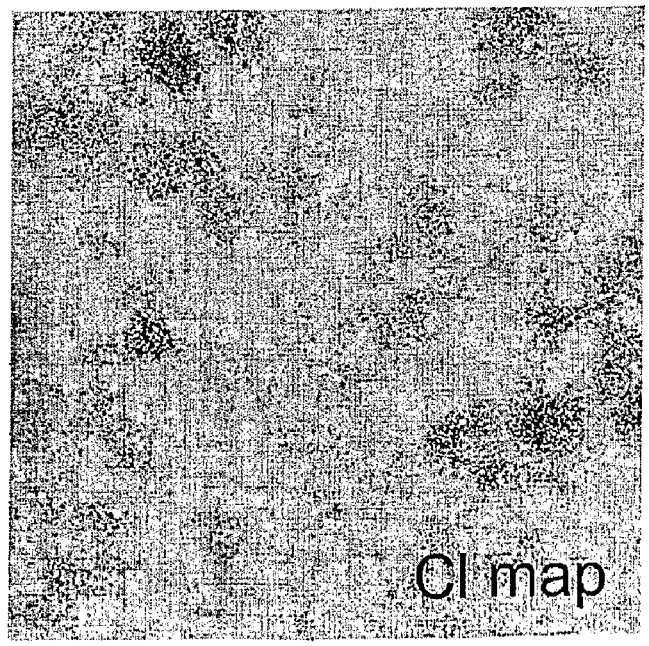

Elemental mapping, using a 120 keV scanning transmission electron microscope (STEM) shows clearly that chlorine is adsorbed onto the nanoparticles, and is not taken up in the surrounding matrix of binder material. FIGS. 3(a) and 3(b) show the elemental map for chlorine and the corresponding micrograph for a powder doped with 10% NaCl. The position of the chlorine clearly corresponds to the position of the particles.

EXAMPLE 2 p-Type and n-Type Doping with $MgCl_2$

In the second example of doping according to the invention, magnesium chloride was used to change the doping level and doping type of the nanoparticulate ink, produced from the nominally intrinsic commercially obtained nanopowder specified above, by its addition in various proportions by weight relative to the amount of powder. The quantity of binder was kept constant, at an amount equivalent to 8% by volume of the undoped composition.

Figure 2B:
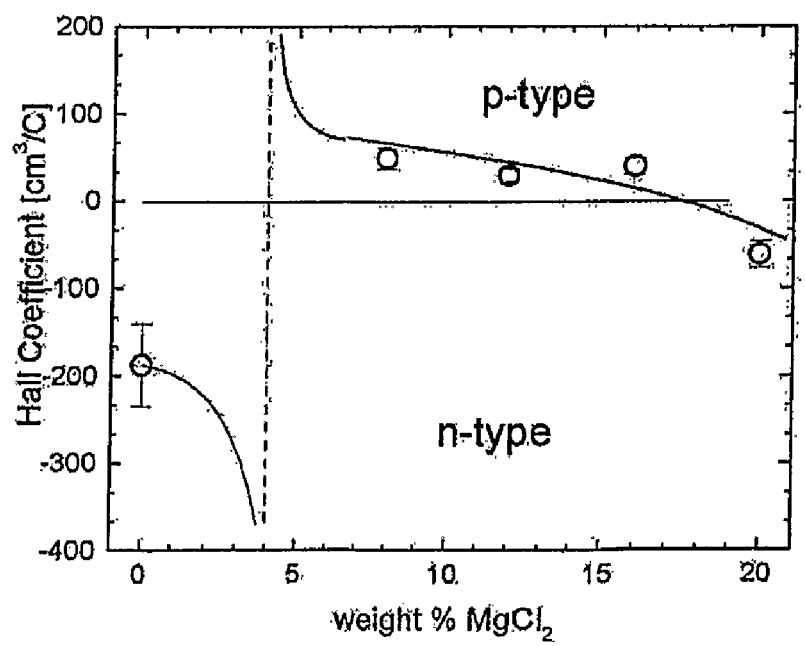

FIG. 2(b) shows the behaviour of the Hall coefficient, which is inversely proportional to the net carrier concentration, as a function of the amount of $MgCl_2$ added to the mixture. For 4% doping, it was not possible to observe a Hall voltage, indicating that the carrier concentration is zero and the Hall coefficient is undefined. This suggests that the initial doping occurs by trapping or elimination of conduction electrons from the n-type particles.

For additions of $MgCl_2$ between 4% and 16% by weight the Hall coefficient is positive, but decreases with increasing concentration, indicating p-type conductivity. For 20% $MgCl_2$, the conductivity becomes n-type again. In this case, however, it appears that the Hall coefficient passes smoothly through zero, which could be interpreted as a change in net doping type caused by competition between two effects. This could either be co-adsorption of anion or cation species, or adsorption of one type of ion in two different charge states. It can be seen that the amount of $MgCl_2$ added to the mixture should be in the range of approximately 0 to 20 weight % [0-3.3 molar %].

EXAMPLE 3

P-N Junction with NaCl Doped Metallurgical Grade Silicon

The abovementioned 2305 grade metallurgical silicon was milled for 180 minutes in an orbital pulveriser and was used for both p and n layers in a diode structure. The average particle size obtained under these milling conditions was 200 nm, with a large size distribution.

400 mg of the powder was used in its initial state to produce an n-type ink. To produce the p-type ink, 400 mg of the powder was mixed with a solution of NaCl in deionised water, so that the proportion of NaCl was 6% by weight of the dry silicon. After mixing the solution was oven dried for three days at 60° C. to evaporate the water.

Inks were produced from both doped and undoped powders by mixing the powder with 200 μl of the same self-polymerising binder described above, and approximately 400 μl of the same commercial lacquer thinner to adjust the viscosity.

Figure 4A:
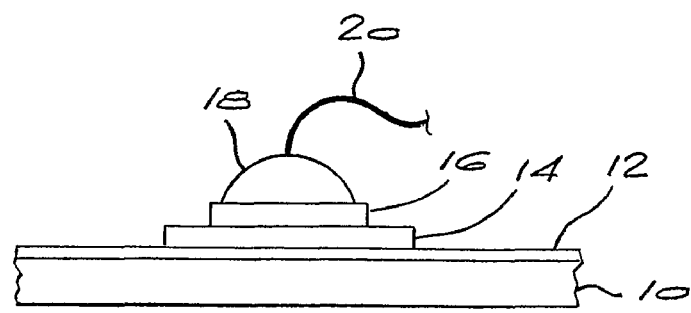
FIGS. 4(a) and 4(b) are schematic side and top views, respectively, of a prototype diode structure according to the invention.
Figure 4B:
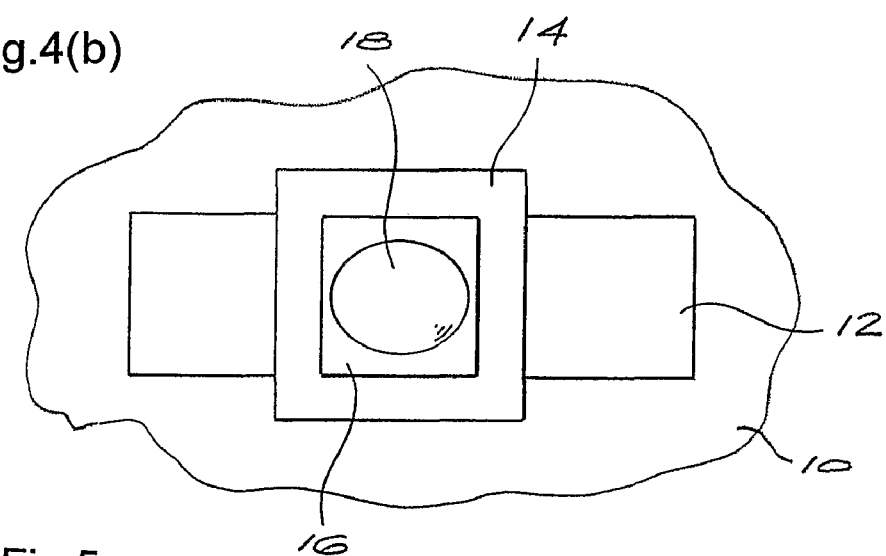

FIGS. 4(a) and 4(b) show, schematically, a prototype diode fabricated as a test structure to demonstrate the rectifying properties of a p-n junction obtainable using the above described powders. The diode structure was formed on a substrate 10 comprising 100 micron polyester film. The substrate was cut from a sheet of standard Xerox photocopy transparency material. A first conductor 12 was stencil printed on the substrate using Dupont 5000 silver contact material, to define a contact layer 20 microns thick and 7 mm wide. A layer 14 of p-type ink, approximately 11 mm square and 50 microns thick, was drop cast onto the silver bottom contact 12. After further drying for a day under ambient conditions, an n-type layer 16 was formed by drop casting n-type ink onto the centre of the p-type layer 14 to form a layer approximately 60 microns thick and 7 mm square. After further drying, a thick top contact layer 18 was painted onto the centre of the p-type layer 16 to allow a contact wire 20 to be applied to the device.

Figure 5:
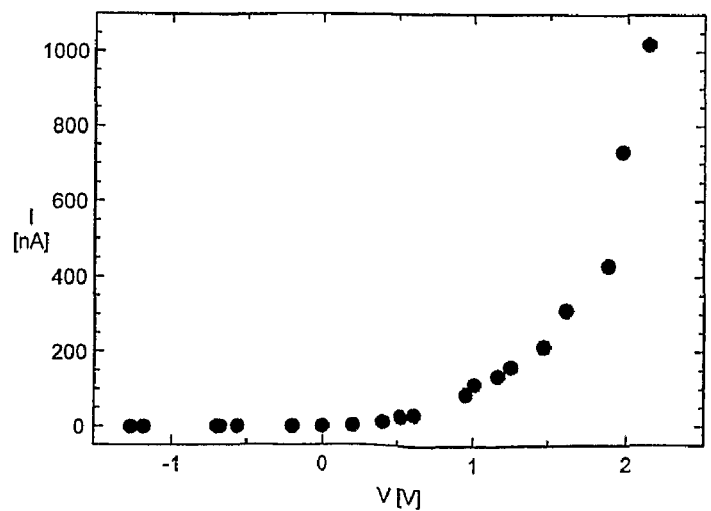
FIG. 5 is a graph showing the current-voltage characteristics of an example of the diode structure of FIG. 4.

FIG. 5 shows the current/voltage characteristics of the device described above. The rectifying behaviour of the p-n junction formed between the two printed silicon layers 14 and 16 is clearly shown, with an onset voltage of approximately 1V.

Potential applications of semiconducting nanoparticles produced by the method of the invention include their use in electroluminescent materials and dye sensitised solar cells (DSC); organic and inorganic semiconductor inks, printed semiconductor layers and printed devices. Depending on the application, single particles may be dispersed randomly in a matrix (quantum dots, OLEDs, DSC cells, organic semiconducting inks), may be regularly arranged (photonic arrays), or may form an interconnecting structure (inorganic semiconducting inks). The latter may be a close packed structure, random network or a fractal agglomeration of different sized clusters. In some applications, where a single layer or multi-layer structure is required, the size restriction may be relaxed so that larger semiconducting particles on the micron or even sub-millimetre scale form the semiconducting component of the composite material or printable composition.

The invention claimed is:

1. A method of doping semiconductor particles to change the carrier concentration and/or type of the semi-conductor material, the method comprising mixing a quantity of semiconductor particles, having a particle size in the range 1 nm to 100 μm, with an ionic salt or a preparation of ionic salts, so that each semiconductor particle as a whole is doped by adsorption or absorption of one or more ionic species of the ionic salt preparation of ionic salts.

2. A method according to claim 1 wherein the ionic salt or preparation of ionic salts comprises one or more metal halides.

3. A method according to claim 2 wherein the ionic salt or preparation of ionic salts comprises one or more alkali halides, rare earth halides, or transition metal halides.

4. A method according to claim 1 wherein the ionic salt or preparation of ionic salts comprises one or more alkali metal salts.

5. A method according to claim 1 wherein the ionic salt or preparation of ionic salts comprises one or more rare earth salts.

6. A method according to claim 1 wherein the ionic salt or preparation of ionic salts comprises one or more transition metal salts.

7. A method according to claim 1 wherein the ionic salt or preparation of ionic salts comprises sulphates, carbonates, nitrates or similar anionic complexes.

8. A method according to claim 1 wherein the ionic salt or preparation of ionic salts comprises a compound comprising a metal cation and anion group.

9. A method according to claim 1 comprising the addition of a preparation of ionic salts with an excess of a cationic species, achieved by the addition of the base of the corresponding salt, to a quantity of semiconductor particles.

10. A method according to claim 9 wherein the cationic species is an alkali metal, rare earth metal, transition metal or other positively charged metal ion.

11. A method according to claim 9 wherein the salt is sodium chloride (NaCl) and the base is sodium hydroxide (NaOH).

12. A method according to claim 9 wherein the salt is magnesium chloride ($MgCl_2$) and the base is magnesium hydroxide ($Mg(OH)_2$).

13. A method according to claim 1 comprising the addition of a preparation of ionic salts with an excess of an anionic species, achieved by the addition of the acid of the corresponding salt, to a quantity of semiconductor particles.

14. A method according to claim 13 wherein the anionic species is a halogen, sulphate, carbonate, nitrate or other negatively charged species or complex.

15. A method according to claim 13 wherein the salt is sodium chloride (NaCl) and the acid is hydrochloric acid (HCl).

16. A method according to claim 13 wherein the salt is magnesium chloride ($MgCl_2$) and the acid is hydrochloric acid (HCl).

17. A method according to claim 1 wherein the semiconductor particles comprise a group IV element; a binary, ternary or quaternary compound semiconductor; an oxide; or a chalcogenide semiconductor material.

18. A method according to claim 17 wherein the semiconductor particles comprise silicon.

19. A method according to claim 18 wherein the semiconductor particles comprise intrinsic silicon.

20. A method according to claim 18 wherein the semiconductor particles comprise n-type material.

21. A method according to claim 19 wherein the semiconductor particles comprise metallurgical grade silicon.

22. A method according to claim 1 wherein the semiconductor particles have a particle size in the range from 10 nm to 1000 nm.

23. A method according to claim 22 wherein the semiconductor particles have a particle size in the range from 50 nm to 500 nm.

24. A method according to claim 23 wherein the semiconductor particles comprise nominally intrinsic silicon nanopowder with a mean particle size of 60 nm.

25. A method according to claim 23 wherein the semiconductor particles comprise metallurgical grade silicon nanopowder with a mean particle size of 200 nm.

26. A printable composition comprising semiconductor particles doped according to the method of claim 1, a binder, and a solvent.

27. A printable composition according to claim 26 wherein the semiconductor particles are doped with the ionic salt or a preparation of the salt prior to mixing with the binder and/or solvent.

28. A printable composition according to claim 26 wherein the semiconductor particles are mixed with the binder and/or solvent prior to addition of the ionic salt or a preparation of the salt.

29. A printable composition according to claim 26 wherein the binder is cellulose acetate butyrate (CAB).

30. A printable composition according to claim 26 wherein the solvent is chloroform, acetone or thinners.

31. A printable composition according to claim 26 wherein the binder is a polyester or autopolymerising ester (monomer) and the solvent is an alcohol, acetone or thinners.

32. A printable composition according to claim 31 wherein the alcohol is ethanol.

33. A semiconducting composite composed of an admixture of semiconductor particles doped according to the method of claim 1, and a binder.

34. A semiconductor device comprising a substrate, first and second layers of semiconductor particles deposited on the substrate in contact with one another, and respective electrical contacts made to the first and second layers, wherein each of the first and second layers comprises a printable composition according to claim 26, one of the first and second layers having n-type properties and the other of the first and second layers having p-type properties so that a p-n junction is defined between the layers.

* * * * *